United States Patent
Kamp et al.

(10) Patent No.: US 7,177,335 B2
(45) Date of Patent: Feb. 13, 2007

(54) SEMICONDUCTOR LASER ARRAY WITH A LATTICE STRUCTURE

(75) Inventors: Martin Kamp, Randersacker (DE); Martin Müller, Gerbrunn (DE)

(73) Assignee: Nanoplus GmbH, Gerbrunn (DE)

( * ) Notice: Subject to any disclaimer, the term of this patent is extended or adjusted under 35 U.S.C. 154(b) by 220 days.

(21) Appl. No.: 10/734,104

(22) Filed: Dec. 11, 2003

(65) Prior Publication Data

US 2005/0129084 A1 Jun. 16, 2005

(51) Int. Cl.
*H01S 3/13* (2006.01)
*H01S 5/00* (2006.01)

(52) U.S. Cl. ............. 372/46.01; 372/45.01; 372/29.02

(58) Field of Classification Search ........ 372/29.02, 372/45.01, 46.01
See application file for complete search history.

(56) References Cited

U.S. PATENT DOCUMENTS

| | | | | |
|---|---|---|---|---|
| 4,754,459 A | * | 6/1988 | Westbrook | 372/32 |
| 4,805,184 A | * | 2/1989 | Fiddyment et al. | 372/96 |
| 5,345,459 A | * | 9/1994 | Richardson et al. | 372/34 |
| 5,422,904 A | * | 6/1995 | Gorfinkel et al. | 372/50.1 |
| 5,457,709 A | | 10/1995 | Capasso et al. | 372/45 |
| 5,509,025 A | | 4/1996 | Capasso et al. | 372/45 |
| 5,936,989 A | | 8/1999 | Capasso et al. | 372/45 |
| 5,978,397 A | | 11/1999 | Capasso et al. | 372/45 |
| 6,137,817 A | | 10/2000 | Baillargeon et al. | 372/45 |
| 6,400,744 B1 | | 6/2002 | Capasso et al. | 372/96 |
| 6,560,259 B1 | | 5/2003 | Hwang | 372/45 |
| 6,665,325 B2 | | 12/2003 | Beck et al. | 372/46 |
| 6,671,306 B1 | * | 12/2003 | Forchel et al. | 372/96 |
| 6,846,689 B2 | * | 1/2005 | Forchel et al. | 438/31 |
| 2004/0013145 A1 | | 1/2004 | Faist et al. | 372/45 |

FOREIGN PATENT DOCUMENTS

| | | |
|---|---|---|
| EP | 0 877 454 | 11/1998 |
| EP | 1 133 035 | 9/2001 |

OTHER PUBLICATIONS

Aellen et al, "Continuous-Wave Distributed-Feedback Quantum-Cascade Lasers on a Peltier Cooler", *Applied Physics Letters*, (© 2003 American Institute of Physics) vol. 83, No. 10, Sep. 8, 2003, pp. 1929-1931.

Anders et al, "Room-Temperature Emission of GaAs/AlGaAs Superlattice Quantum-Cascade Lasers at 12.6 µm", *Applied Physics Letters*, (© 2002 American Institute of Physics) vol. 80, No. 11, Mar. 18, 2002, pp. 1864-1866.

(Continued)

*Primary Examiner*—Minsun Oh Harvey
*Assistant Examiner*—Marcia A. Golub
(74) *Attorney, Agent, or Firm*—Michaelson & Associates; Peter L. Michaelson; George Wolken, Jr.

(57) ABSTRACT

The present invention relates to laser diodes with single mode emission at high output powers, as well as to structures and processes facilitating simple manufacture of such a devices. The invention includes a semiconductor laser (10) with a semiconductor substrate (11), a laser layer (13) arranged on the semiconductor substrate, an array of waveguide ridges (18) arranged at a distance from the laser layer, and several strip-shaped lattice structures (23) arranged on the flat surface between the waveguide ridges. The lattice structure (23) is formed on an insulating or barrier layer (26) at a distance from the laser layer above the laser layer (13). Processes for the production of such a semiconductor laser are also disclosed.

5 Claims, 5 Drawing Sheets

OTHER PUBLICATIONS

Anders et al, "Room Temperature Lasing of Electrically Pumped Quantum Cascade Micro-cylinders", *Physica E (2003)*, (© Elsevier Science B.V.) vol. 17, pp. 626-628.

Beck et al, "Continuous Wave Operation of Quantum Cascade Lasers", *Journal of Crystal Growth 251 (2003)* (© 2002 Elsevier Science B.V.) pp. 697-700.

Capasso et al, "Quantum Cascade Lasers: Ultrahigh-Speed Operation, Optical Wireless Communication, Narrow Linewidth, and Far-Infrared Emission", *IEEE Journal of Quantum Electronics* (© 2002 IEEE) vol. 38, No. 6, Jun. 2002, pp. 511-532.

Coldren et al, "Continuously-Tunable Single-Frequency Semiconductor Lasers", *IEEE Journal of Quantum Electronics* (© 1987 IEEE) vol. QE-23, No. 6, Jun. 1987, pp. 903-908.

Colombelli et al, "Quantum Cascade Surface-Emitting Photonic Crystal Laser", *Science*, vol. 302, Nov. 21, 2003, pp. 1374-1377.

Delorme, "Widely Tunable 1.55-µm Lasers for Wavelength-Division-Multiplexed Optical Fiber Communications", *IEEE Journal of Quantum Electronics* (© 1998 IEEE) vol. 34, No. 9, Sep. 1998, pp. 1706-1716.

Faist et al, "Bound-to-Continuum and Two-Phonon Resonance Quantum-Cascade Lasers for High Duty Cycle, High-Temperature Operation", *IEEE Journal of Quantum Electronics* (© 2002 IEEE) vol. 38, No. 6, Jun. 2002, pp. 533-546.

Faist et al, "Distributed Feedback Quantum Cascade Lasers" *Applied Physics Letters* (© 1997 American Institute of Physics) vol. 70, No. 20, May 19, 1997, pp. 2670-2672.

Faist et al, "Quantum Cascade Laser" Science, vol. 264, Apr. 22, 1994, pp. 553-556.

Gauggel et al, "Wide-Range Tunability of GaInP-AlGaInP DFB Lasers with Superstructure Gratings", *IEEE Photonics Technology Letters* (© 1997 IEEE) vol. 9, No. 1, Jan. 1997, pp. 14-16.

Gmachl et al, "Quantum Cascade Lasers with a Heterogeneous Cascade: Two-Wavelength Operation" *Applied Physics Letters* (© 2001 American Institute of Physcis) vol. 79, No. 5, Jul. 30, 2001, pp. 572-574.

Gmachl et al, "Single-Mode, Tunable Distributed-Feedback and Multiple-Wavelength Quantum Cascade Lasers" *IEEE Journal of Quantum Electronics* (© 2002 IEEE) vol. 38, No. 6, Jun. 2002, pp. 569-581.

Gmachl et al, "Temperature Dependence and Single-Mode Tuning Behavior of Second-Harmonic Generation in Quantum Cascade Lasers", *Applied Physics Letters* (© 2004 American Institute of Physics) vol. 84, No. 15, Apr. 12, 2004, pp. 2751-2753.

Hofling et al, "Edge-Emitting GaInAs-AlGaAs Microlasers" *IEEE Photonics Technology Letters* (© 1999 IEEE) vol. 11, No. 8, Aug. 1999, pp. 943-945.

Hofling et al, "GaAs/AlGaAs Quantum Cascade Micro Lasers Based on Monolithic Semiconductor-Air Bragg Mirrors" *Electronics Letters*, vol. 40, No. 2, Jan. 22, 2004.

Hofstteter et al, "High-Temperature Operation of Distributed Feedback Quantum-Cascade Lasers at 5.3 µm" *Applied Physics Letters* (© 2001 American Institute of Physics) vol. 78, No. 4, Jan. 22, 2001, pp. 396-398.

Hong et al, "Cascaded Strongly Gain-Coupled (SGC) DFB Lasers with 15-nm Continuous-Wavelength Tuning", *IEEE Photonics Technology Letters* (© 1999 IEEE) vol. 11, No. 10, Oct. 1999, pp. 1214-1216.

Hvozdara et al, "Quantum Cascade Lasers with monolithic Air-Semiconductor Bragg Reflectors", *Applied Physics Letters* (© 2000 American Institute of Physics) vol. 77, No. 9, Aug. 28, 2000, pp. 1241-1243.

Ishii et al, "Quasicontinuous Wavelength Tuning in Super-Structure-Grating (SSG) DBR Lasers" *IEEE Journal of Quantum Electronics* (© 1996 IEEE) vol. 32, No. 3, Mar. 1996, pp. 433-441.

Jayaraman et al, "Theory, Design, and Performance of Extended Tuning Range Semiconductor Lasers with Sampled Gratings" *IEEE Journal of Quantum Electronics* (© 1993 IEEE) vol. 29, No. 6, Jun. 1993, pp. 1824-1834.

Kazarinov et al, "Possibility of the Amplification of Electromagnetic Waves in a Semiconductor with a Superlattice", *Soviet Physics—Semiconductors*, vol. 5, No. 4, Oct. 1971, pp. 707-709.

Kohler et al, "Single-Mode Tunable, Pulsed, and Continuous Wave Quantum-Cascade Distributed Feedback Lasers at $\lambda \cong 4.6$-4.7 µm", *Applied Physics Letters* (© 2000 American Institute of Physics) vol. 76, No. 9, Feb. 28, 2000, pp. 1092-1094.

Kohler, "Single-Mode Tunable Quantum Cascade Lasers in the Spectral Range of the $CO_2$ Laser at $\lambda$=9.5-10.5 µm", *IEEE Photonics Technology Letters* (© 2000 IEEE) vol. 12, No. 5, May 2000, pp. 474-476.

Kuznetsov, "Theory of Wavelength Tuning in Two-Segment Distributed Feedback Lasers" *IEEE Journal of Quantum Electronics* (© 1988 IEEE) vol. 24, No. 9, Sep. 1988, pp. 1837-1844.

Mason et al, "Ridge Waveguide Sampled Grating DBR Lasers with 22-nm Quasi-Continuous Tuning Range", *IEEE Photonics Technology Letters* (© 1998 IEEE) vol. 10, No. 9, Sep. 1998, pp. 1211-1213.

Muller et al, "Electrically Tunable, Room-Temperature Quantum-Cascade Lasers", *Applied Physics Letters* (© 1999 American Institute of Physics) vol. 75, No. 11, Sep. 13, 1999, pp. 1509-1511.

Muller et al, "Wide-Range-Tunable Laterally Coupled Distributed Feedback Lasers Based on InGaAsP-InP", *Applied Physics Letters* (© 2001 American Institute of Physics) vol. 79, No. 17, Oct. 22, 2001, pp. 2684-2686.

Page et al, "300 K Operation of a GaAs-Based Quantum-Cascade Laser at $\lambda \approx 9$ µm", *Applied Physics Letters* (© 2001 American Institute of Physics) vol. 78, No. 22, May 28, 2001, pp. 3529-3531.

Page et al, "High Reflectivity Metallic Mirror Coatings for Mid-Infrared ($\lambda \approx 9$ µm) Unipolar Semiconductor Lasers", *Semiconductor Science and Technology* (© 2002 IOP Publishing Ltd) vol. 17, pp. 1312-1316.

Page et al, "Optimised Device Processing for Continuous-Wave Operation in GaAs-Based Quantum Cascade Lasers", *Electronics Letters*, vol. 39, No. 14, Jul. 10, 2003.

Pflugl et al, "High-Temperature Performance of GaAs-Based Bound-to-Continuum Quantum-Cascade Lasers", *Applied Physics Letters* (© 2003 American Institute of Physics) vol. 83, No. 23, Dec. 8, 2003, pp. 4698-4700.

Rochat et al, "Long-Wavelength ($\lambda \approx 16$ µm), Room-Temperature, Single-Frequency Quantum-Cascade Lasers Based on a Bound-to-Continuum Transition", *Applied Physics Letters* (© 2001 American Institute of Physics) vol. 79, No. 26, Dec. 24, 2001, pp. 4271-4273.

Schrenk et al, "Continuous-Wave Operation of Distributed Feedback AlAs/GaAs Superlattice Quantum-Cascade Lasers" *Applied Physics Letters* (© 2000 American Institute of Physics) vol. 77, No. 21, Nov. 20, 2000, pp. 3328-3330.

Schrenk et al, "GaAs/AlGaAs Distributed Feedback Quantum Cascade Lasers", *Applied Physics Letters* (© 2000 American Institute of Physics) vol. 76, No. 3, Jan. 17, 2000, pp. 253-255.

Schrenk et al, "High Performance Single Mode GaAs Quantum Cascade Lasers", *Physica E* (© 2002 Elsevier Science B.V.) vol. 12, pp. 840-843.

Sirtori et al, "GaAs/$Al_xGa_{1-x}$As Quantum Cascade Lasers", *Applied Physics Letters* (© 1998 American Institute of Physics) vol. 73, No. 24, Dec. 14, 1998, pp. 3486-3488.

Sirtori et al, "GaAs-AlGaAs Quantum Cascade Lasers: Physics, Technology, and Prospects", *IEEE Journal of Quantum Electronics*, (© 2002 IEEE) vol. 38, No. 6, Jun. 2002, pp. 547-558.

Sirtori et al, "Low-Loss Al-Free Waveguides for Unipolar Semiconductor Lasers", *Applied Physics Letters* (© 1999 American Institute of Physics) vol. 75, No. 25, Dec. 20, 1999, pp. 3911-3913.

Strasser et al, "Intersubband and Interminiband GaAs/AlGaAs Quantum Cascade Lasers", *Physica E* (© 2000 Elsevier Science B.V.) vol. 7, pp. 1-7.

Straub et al, "Simultaneously at Two Wavelengths (5.0 and 7.5 µm) Singlemode and Tunable Quantum Cascade Distributed Feedback Lasers", *Electronics Letters*, vol. 38, No. 12, Jun. 6, 2002, pp. 565-567.

* cited by examiner

SEMICONDUCTOR LASER ARRAY WITH A LATTICE STRUCTURE

FIELD OF THE INVENTION

The present invention relates to a semiconductor laser device and to processes and materials for the fabrication of such a device.

BACKGROUND OF THE INVENTION

The optical properties of semiconductor lasers such as emission wavelength, output power and beam quality can be controlled over a wide range by the use of specific semiconductor materials and device structures. For applications calling for moderate power levels (a few milli-Watts, mW) in combination with a well-defined, monomode emission, devices such as DFB (distributed feedback) or DBR (distributed Bragg reflector) laser diodes are typically employed. They have a lattice structure which extends through the laser layer and which facilitates the construction of a monomode laser diode in which, in contrast to multimode laser diodes, laser radiation with only one specific wavelength is emitted and other modes are suppressed by the lattice structure. Besides the lattice, DFB and DBR laser diodes incorporate a waveguiding structure with approximate dimensions of a few μm by several 100 μm in the epitaxial layer plane (μm=micron=$10^{-6}$ meter). This structure is formed by an epitaxial waveguiding layer in combination with a laterally patterned waveguide. Depending on the type of the lateral structure, these waveguiding structures are referred to in the art as ridge waveguide, buried ridge or buried heterostructure. One key feature of this waveguiding structure is that it is single-mode, which means that only one mode with a well-defined field distribution is guided. Due to the small size of the waveguiding structure, the output power of these devices is usually limited to the above mentioned level of a few mW. An increase of the operating current results in excessive heating or facet failure due the high power density at the output facet.

For high output powers (up to approximately several hundred mW or W), larger structures with better heat spreading capabilities and larger output apertures are needed. In this case however, the large width of the lateral guiding structure results in an ill-defined lateral mode profile for the emitted radiation. This occurs because not only one, but several modes are capable of propagating in a large waveguide. The actual field or intensity distribution will be a superposition of the individual modes. So the intensity distribution of the resulting superposition mode will strongly depend on the optical power in each constituent mode. Fluctuations of the temperature or changes of the operating current can influence the power levels of the various modes in a large waveguide, which in turn implies that the intensity distribution of the resulting mode will also change. Coupling of high power, large aperture lasers to optical systems, e.g., optical fibers, is therefore difficult. Operating these devices at a single wavelength is also difficult, even if a grating structure is included into the laser structure. The wavelength selection of a grating depends not only on the grating period, but also on the effective refractive index of the grating structure. The relation is known in the art as the Bragg condition and given by $\lambda=2*n_{eff}*d$, where $\lambda$ denotes the selected wavelength, d represents the period of the grating and $n_{eff}$ is the effective refractive index of the structure. $n_{eff}$ is not constant for all the individual modes in a large waveguide. As discussed above, the power distribution between these modes is influenced by the temperature and carrier density in the waveguide, so fluctuations of these quantities lead to a change of the effective index and hence fluctuations of the laser wavelength.

In order to overcome the above mentioned difficulties, a number of alternative structures have been proposed and realized. One possibility is to use a laser with a master oscillator and an amplifier section, where the master oscillator provides a well-defined, monomode input for the amplifier. However, these structures are prone to instabilities caused by the feedback of light from the amplifier into the master oscillator, which can result in strong disturbance of the master oscillator.

Another approach is to use an inclined feedback grating. This structure is referred to in the art as alpha-DFB laser. Here the grating provides both wavelength selective feedback as well as lateral waveguiding. The fabrication of these devices, however, requires two epitaxial steps, the first one being used to define the lower cladding and active region on a semiconductor substrate, the second one completes the laser layer after the grating has been fabricated. The necessity of a regrowth step on a patterned surface limits this technique to a subset of available semiconductor materials, and does not represent a general solution for the generation of high single-mode output powers.

SUMMARY OF THE INVENTION

A primary objective of the present invention is to provide a laser diode with single mode emission at high output powers. Another objective is to provide a structure which facilitates simple manufacturing of these laser diodes. A further objective of the present invention is to provide a process particularly suitable for the production of a single-mode high-power laser diode.

According to some embodiments of the invention, a semiconductor laser is provided with a semiconductor substrate. A laser layer is arranged on the semiconductor substrate. An array of two or more waveguide ridges is arranged at a distance from the laser layer. The width of the ridges and the distance between them are chosen in a way that light can couple from one waveguide into the neighbouring waveguides as it propagates along the waveguide. The lasers formed by each of the waveguiding ridges therefore do not operate independently of each other. The coupling of the individual waveguide modes leads to the formation of a coherent guided mode which extends across all coupled waveguides. In contrast to the modes in large waveguides, the mode formed by the coupling of the individual waveguide modes has a very well-defined intensity distribution and effective refractive index. In order to achieve an improved performance of the device, it may be advantageous to use variations in the ridge width and spacing across the array.

A strip-shaped lattice is formed on the flat portions between the waveguide ridges and, in some embodiments, at the outer sides of the outermost waveguide ridges. This lattice is formed at a distance above the laser layer. The extent of the lattice can be restricted to the flat portions between the waveguides, but it can also be formed lateral to the two outer ridges. The lattice consists of alternating portions of a conducting and a non-conducting or less conducting material. One possible way to realize said lattice would be to use a metal to form the conductive portions of said lattice. Light is absorbed in the conductive portions of the lattice, which means the lattice acts as a periodic absorber for the laser radiation. Furthermore, the lattice structure will also provide a periodic modulation of the refractive index. Therefore, the addition of the lattice to the array of waveguide ridges forms an array of coupled DFB lasers. In this way the laser array facilitates a complex coupling of the laser radiation with the lattice structure with lateral modulation of the real—and imaginary parts of the refractive index. Laser diodes according to some embodiments of the invention therefore have a high degree of insensitivity to back-reflections, which enables them to be used without an optical isolator, for example in applications for optical fiber transmission. Significant laser emission will occur only at a wavelength where the absorption provided by the lattice structure is minimal. The absorption shows a single minimum at a wavelength determined by the lattice period and the effective refractive index of the array of waveguide ridges. The combination of the well-defined optical mode as provided by the array of waveguiding ridges in combination with the lattice structure results in a monomode laser with a large aperture. For a given output power, the heat dissipation and power density at the facet are therefore much lower than for a single waveguiding ridge. On the other hand, the advantages of a single waveguide DFB structure such as a well-defined mode profile and single-mode operation are retained.

An embodiment of the invention provides an array of DFB laser diodes with a lattice structure produced following the conclusion of the epitaxial growth of the laser layer for the completion of the semiconductor laser wafer and following the formation of the waveguide ridge. By virtue of this fabrication technique, it is possible to determine the individual amplification spectrum of the laser layer and semiconductor laser wafer before the production of the lattice structure. By selective predefinition of the parameters of the lattice structure, it is possible to be able to subsequently produce the desired laser profile in an exact manner, and thus to be able to reproducibly manufacture arrays of laser diodes with precisely defined wavelengths or laser modes.

The structural design according to various embodiments of the invention also facilitates an undisturbed, continuous formation of the laser layer in the epitaxial process so that unnecessary defects, which can impair the power output characteristic of the laser layer or the DFB laser diode, do not arise. The arrangement of the lattice structure at a distance from the active laser layer also prevents the subsequent impairment of the laser layer. Since the formation of defects is especially critical for lasers operating at high output powers, the undisturbed growth and operation of the laser layers in the present invention is of particular advantage. As the laser layer is grown without interruption, the manufacturing cost of the lasers can be significantly reduced.

To permit precise setting of the distance or relative position between the lattice structure and the active laser layer of the laser diode array in the production of the laser diode array, the lattice structure can be arranged on a barrier layer arranged in parallel to the laser layer. A selective etching process can be used to stop the removal of material at the barrier layer during the formation of the waveguide array. The upper section of this barrier layer is advantageously realized in a manner suitable to provide electrical insulation between the lattice and the laser layer.

If a metal, for example chromium, is used to form the conducting parts of the lattice structure, the advantageous effects described in the foregoing can be achieved to a particularly comprehensive extent. Irrespective of the material selected to construct the lattice structure, the lattice structure can also be formed by material removal, not only by material application.

It proves particularly advantageous for the structural regions of the lattice structure to be arranged adjacent to the sides of the waveguide ridges and for the width of the waveguide ridge to have dimensions such that base points of the sides are located in the peripheral region of the radiation emitted from the active zone of the laser layer. This facilitates effective coupling between the laser radiation and the lattice structure.

In order to improve the electrical injection, the conductive (e.g., metallic) lattice structure is advantageously placed on a thin insulation layer (e.g., native or artificial oxide). The thickness of the insulator layer should be small (typically a few nanometers) in order to maintain an effective coupling between the laser radiation and the metal grating. This layer is also used to suppress a potential penetration of the lattice material into the semiconductor material of the laser layers and therefore also serves as a barrier layer.

For the improvement of the electrical injection surface and the effects of the lattice structure, it also proves advantageous for the sides of the waveguide ridges to be arranged substantially at right angles to the plane in which the lattice structure extends, within the accuracy attainable by the manufacturing process.

In a process according to the invention, a complete semiconductor laser structure is produced on a semiconductor substrate by an epitaxial process with the subsequent formation of an array of waveguide ridges by subjecting the semiconductor laser structure to a material removal process to form carrier surfaces arranged on both sides of the waveguide ridge and subsequent application of a lattice structure on the carrier surfaces.

The processes described herein thus facilitate the production of functional laser diode arrays in a first process phase, thereby facilitating the precise checking and determination of the electrical and optical properties, for example determination of the individual amplification spectrum of the semiconductor wafer used for the laser fabrication. Only thereafter in a second process phase, by the formation of lattice structures alongside the waveguiding ridges with defined parameters, are the originally multi-mode laser diodes converted into arrays of diode lasers with properties in each case determined by the parameters of the lattice structure.

In the embodiments in which the lattice structure is produced by the application of a lattice structure to the carrier surfaces, the use of a lithographic process is especially advantageous, in particular the use of an electron beam process with subsequent metallization of the lithographic structure.

In the following, the construction of an embodiment of a diode laser array with a lateral lattice structure according to some embodiments of the present invention, and an example of a process for the production thereof, will be explained in detail making reference to the drawings.

For a better understanding of the invention, its operating advantages and specific objects attained, reference is made to the accompanying drawings and descriptive matter in which various embodiments of the invention are illustrated.

BRIEF DESCRIPTION OF THE DRAWINGS

In the drawings.

The drawings herein are schematic only and not to scale, and

DETAILED DESCRIPTION OF THE INVENTION

Figure 1A:
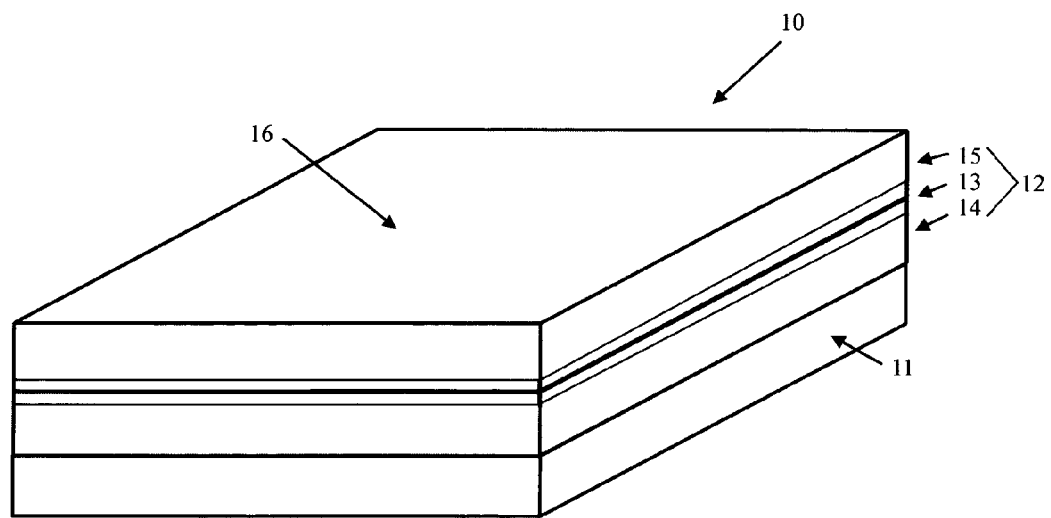
FIG. 1a is a front view illustrating a stage in the production of a laser diode array with a lateral lattice structure.

Referring to the drawings in particular, FIG. 1a is a simplified perspective view of a semiconductor laser or basic laser diode 10 comprising a semiconductor substrate 11 and an epitaxial structure 12 grown thereon. Part of the epitaxial structure 12 is formed by a laser layer 13 based on a lower cladding layer 14 and covered at the top by an upper cladding layer 15. The cladding layers 14 and 15 are doped in order to provide carrier injection into the lasing layer 13. The lower cladding layer is typically n-doped while the upper cladding layer is typically p-doped. The active region in the laser layer 13 can, for example, consist of a single quantum well or several quantum wells. It could also consist of a single layer of quantum dots or several stacked layers of quantum dots, among other structures.

Figure 1B:
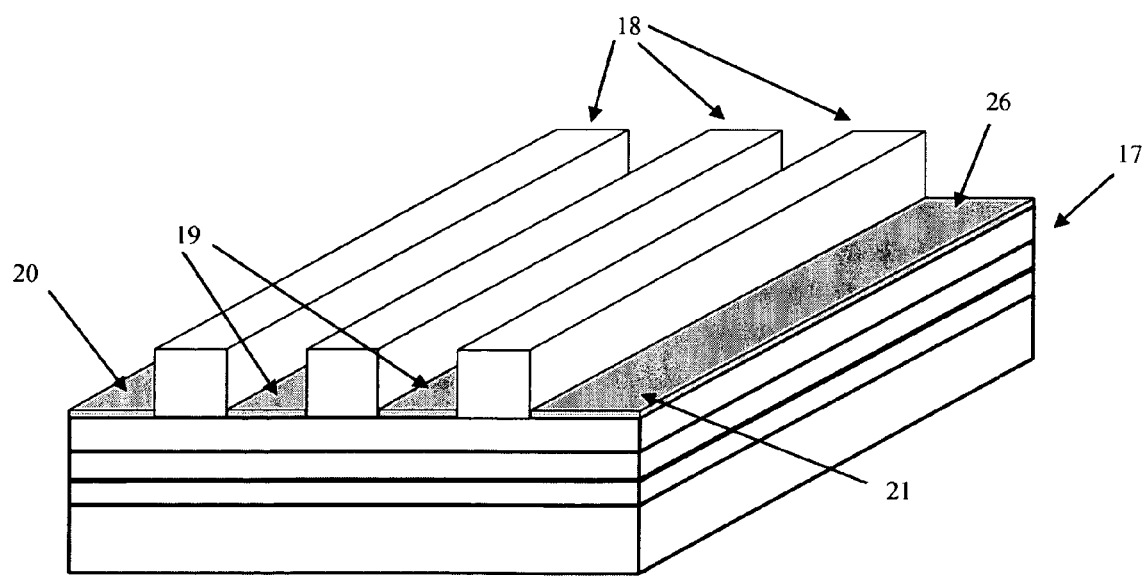
FIG. 1b is a front view illustrating a different stage in the production of a laser diode array with a lateral lattice structure.
Figure 1C:
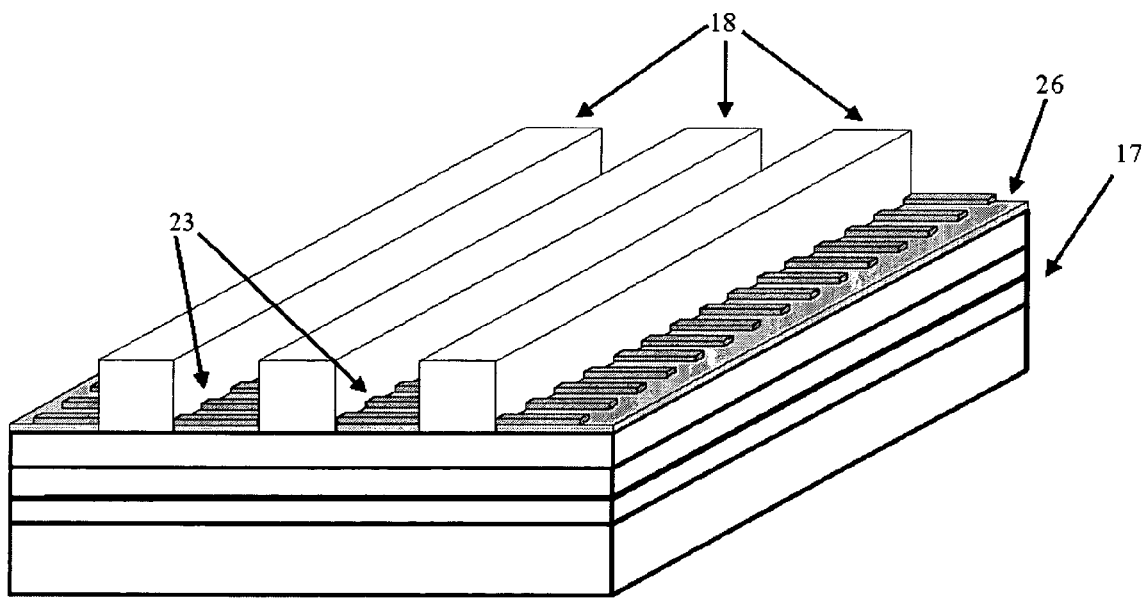
FIG. 1c is a front view illustrating a different stage in the production of a laser diode array with a lateral lattice structure.
Figure 1D:
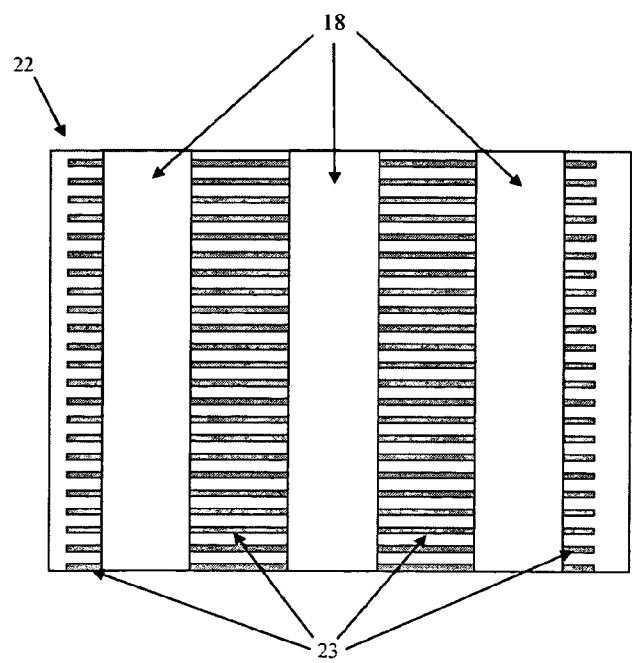
FIG. 1d is a top view illustrating a different stage in the production of a laser diode array with a lateral lattice structure.

The typical basic laser diode 10 shown in FIG. 1a is of cuboid formation with a flat diode surface 16. Commencing from the basic laser diode 10 illustrated in FIG. 1a, the embodiment of an array of optically coupled ridge waveguide DFB laser diodes with a lateral grating structure 22, according to some embodiments of the invention and shown in FIGS. 1c and 1d, is advantageously produced in essentially two process phases. As a transitional stage following the implementation of a first process phase, FIG. 1b shows a waveguide diode 17 in which the diode surface 16 has been subjected to a material removal process, such as for example a dry or wet etching process, in order to obtain the illustrated stepped surface formation with a number of waveguide ridges 18 aligned parallel to each other and extending in the longitudinal direction of the waveguide diode 17. The spacing between the waveguide ridges can be varied over the array, as it may be advantageous for the performance of the device to have the ridges at a non-equidistant spacing. Furthermore, it may be advantageous to use a different width for each of the waveguiding ridges in the array. The aforementioned material removal process gives rise to surfaces 19, which are formed between the waveguide ridges 18. Furthermore, flat surfaces 20 and 21 are created lateral to the outermost waveguides. These surfaces 19, 20, 21, will be referred to in the following as carrier surfaces. In a process step following the etching of the waveguide ridges, the carrier surfaces are typically covered by a thin insulating layer 26.

Commencing from the waveguide diode 17 illustrated in FIG. 1b, the embodiment of an array of optically coupled ridge waveguide DFB laser diodes with a lateral grating structure 22 shown in FIGS. 1c and 1d is produced by forming a metallic lattice structure 23 on the carrier surface 19, typically by subjecting the carrier surface 19 to a lithographic process (e.g., by electron beam lithography) and a subsequent metallization process well-known in the art and not described in detail here. A metallic lattice structure can also be formed on the outer carrier surfaces 20 and 21, again by the application of a lithographic process. This second process phase results in an array of optically coupled ridge waveguide DFB laser diodes with lateral grating structures 22 and 23 illustrated in FIGS. 1c and 1d with the metallic lattice structure 23 arranged on the carrier surfaces 19, 20 and 21 above the laser layer 13. The insulating layer 26 can be utilized to define precisely the position of the structural regions 19, 20 and 21 of the metallic lattice structure 23 arranged on the epitaxial structure 12 relative to the laser layer 13. This insulating layer 26 can be provided in the form of an etch stop layer included in the epitaxial structure 12 which defines the depth of the lithographic structure produced using an etching process and thereby defines the position of the metallic lattice structure 23 relative to the laser layer 13. The insulating layer 26 can also be provided by an additionally deposited layer, which again defines the position of the metallic lattice relative to the laser layer 13.

Figure 2:
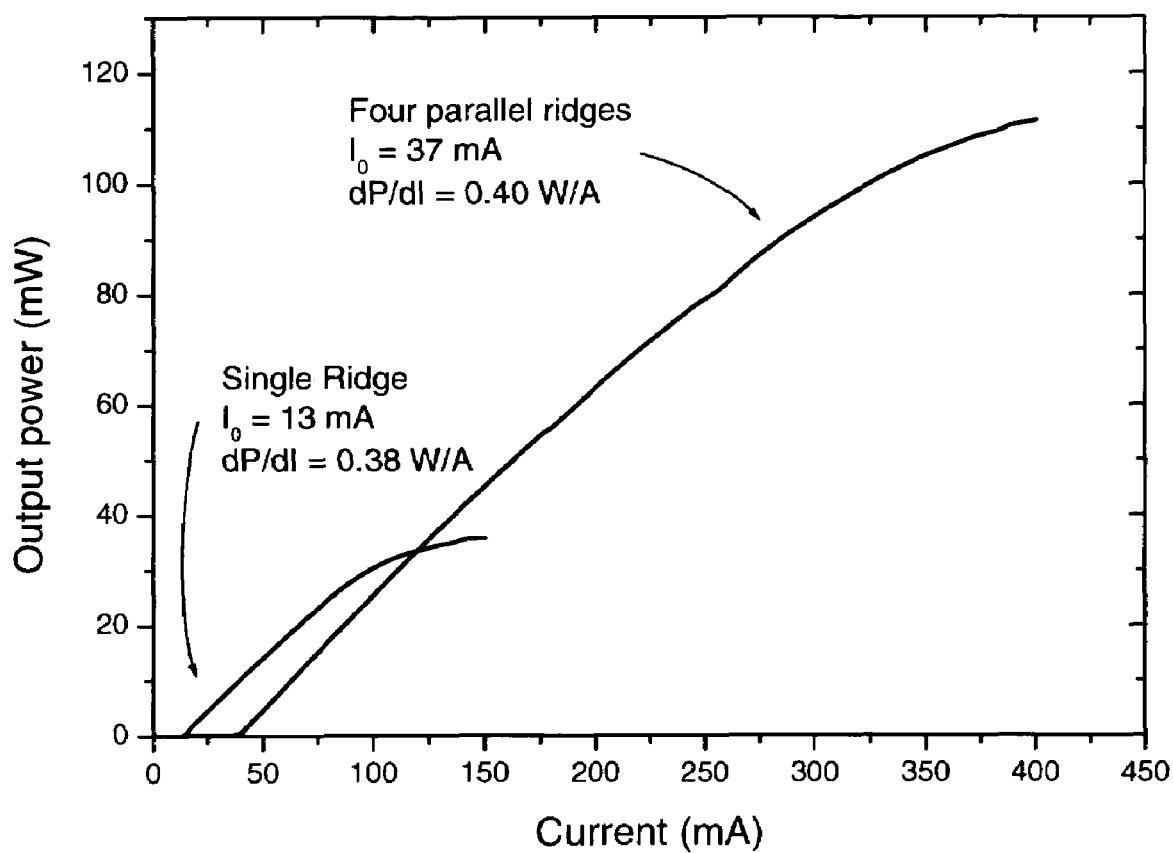
FIG. 2 is a joined plot of the output power characteristic of a single ridge waveguide laser and an array of four coupled ridge waveguide lasers.
Figure 3:
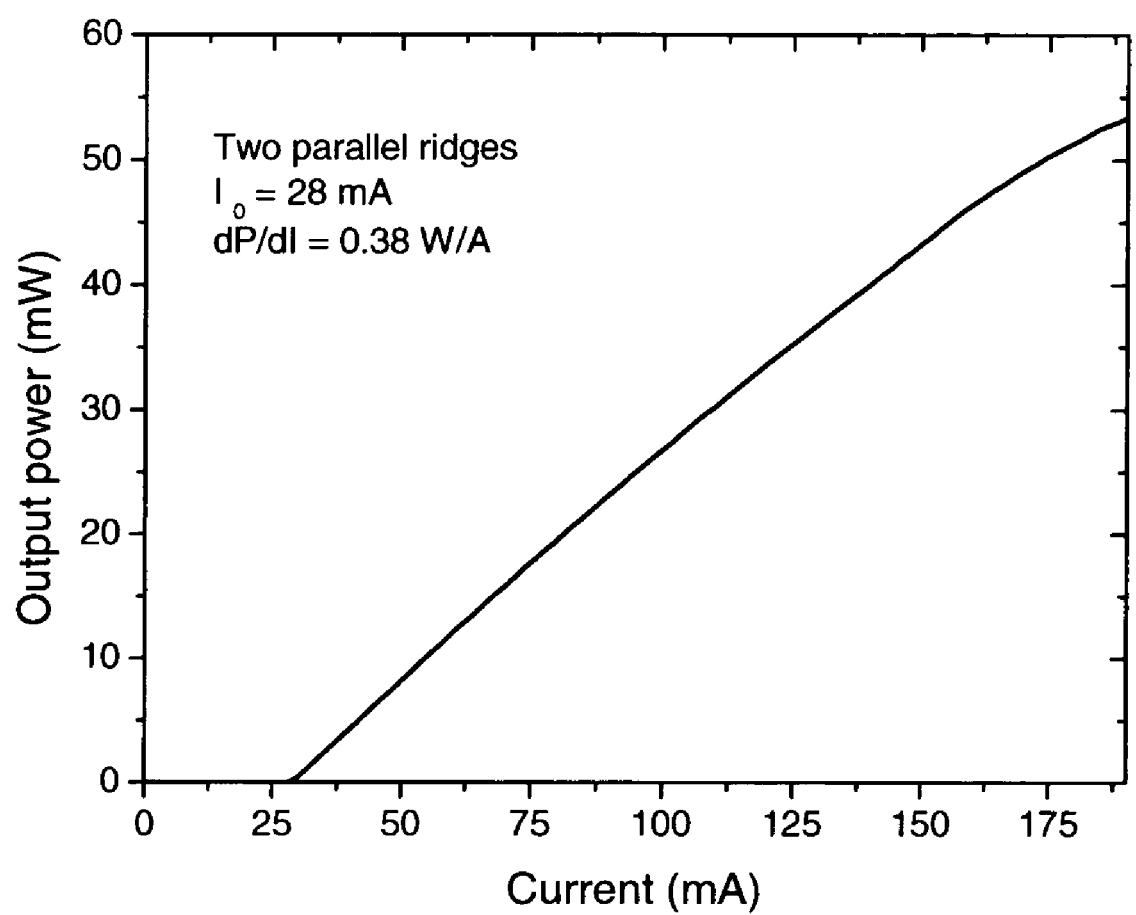
FIG. 3 is a plot of the output power characteristics of two coupled ridge waveguide lasers with a lateral lattice structure.

In FIGS. 2 and 3 an illustration is given of how the maximum output power of an array of ridge waveguide lasers depends on the number of coupled ridge waveguide lasers. The deviation from a linear dependence of the output power on the pump current seen in FIGS. 2 and 3 is believed to be caused by heating of the device. A single ridge waveguide shows a saturation of the output power at a current of approximately 150 mA (milli-Amps) and an output power of 35 mW. If four waveguide ridges are coupled, saturation occurs at a much higher current and a power level of over 110 mW is reached.

FIG. 3 shows the output power characteristic of two coupled ridge waveguides with a lateral lattice. An output power of over 50 mW is obtained.

Figure 4:
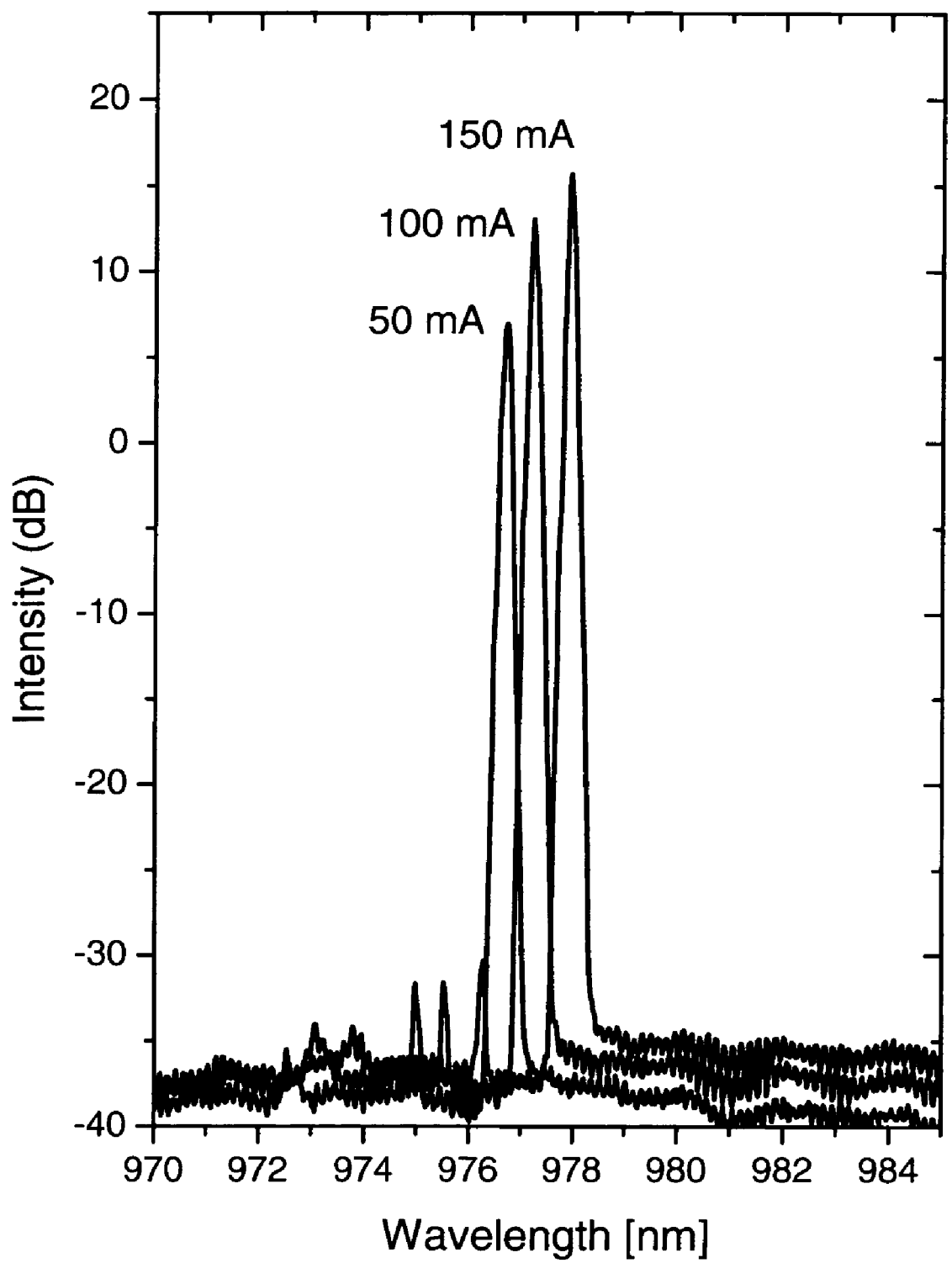
FIG. 4 is a joined plot of the emission spectrum of the two coupled ridge waveguide lasers for three different settings of the drive current.

FIG. 4 shows the emission spectrum of the array with two coupled ridge waveguides and lateral lattice for three different drive currents. Monomode operation of the device is obtained for all currents. The shift of the laser emission to larger wavelength for increasing drive currents is due to heating, which changes the effective refractive index.

While specific embodiments of the invention have been shown and described in detail to illustrate the application of the principles of the invention, it will be understood that the invention may be embodied otherwise without departing from such principles.

What is claimed is:
1. A semiconductor laser, comprising;
a semiconductor substrate;
a laser layer on said semiconductor substrate; at least two
 waveguide ridges located at a distance from said laser layer whereby electrical injection into said laser layer is achieved through at least two of said waveguide ridges, and a first strip-shaped lattice structure comprising alternating portions of conducting and non-conducting or less conducting material, wherein said lattice structure is located on the flat portions of the surface between said ridges and at a distance from said laser layer above said laser layer, and a second strip-shaped lattice structure located lateral to the two outermost of said waveguide ridges, wherein said lattice structure is located on the flat portions of the surfaces lateral to said outermost ridges and at a distance from said laser layer above said laser layer.

2. The semiconductor laser according to claim 1, wherein said lattice structure is located on a barrier or insulating layer wherein said barrier defines the position of said lattice structure relative to said laser layer.

3. The semiconductor laser according to claim 1, wherein said lattice structure comprises a metal.

4. The semiconductor laser according to claim 3, wherein said metal is chromium or a chromium alloy.

5. The semiconductor laser according to claim 1, wherein said first strip-shaped lattice structure is located adjacent to sides of said waveguide ridges, and wherein the width and spacing of said waveguide ridges are selected such that base points of the sides of said waveguide ridges are located in a peripheral region of radiation from an active zone of said laser layer.

* * * * *